(12) United States Patent
Schacht et al.

(10) Patent No.: US 6,495,250 B1
(45) Date of Patent: Dec. 17, 2002

(54) PIGMENTED POROUS MATERIAL

(75) Inventors: Hans-Thomas Schacht, Rheinfelden (DE); Gilbert Moegle, Magstatt-le-Bas (FR)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 0 days.

(21) Appl. No.: 09/441,404

(22) Filed: Nov. 16, 1999

(30) Foreign Application Priority Data

Dec. 16, 1998 (EP) .............................................. 98811238
Feb. 9, 1999 (EP) .............................................. 99810107

(51) Int. Cl.$^7$ ................................................. B23B 3/26
(52) U.S. Cl. ................................. 428/321.5; 428/321.3
(58) Field of Search ........................... 428/321.1, 321.3, 428/317.9, 321.5; 521/50, 87, 97, 113, 120, 128; 106/493

(56) References Cited

U.S. PATENT DOCUMENTS

| | | | |
|---|---|---|---|
| 4,043,951 A | * 8/1977 | Prokai et al. | |
| 4,828,976 A | 5/1989 | Borror et al. | .............. 544/58.4 |
| 4,923,658 A | * 5/1990 | Hover et al. | |
| 5,114,990 A | * 5/1992 | Dethlefs | |
| 5,243,052 A | 9/1993 | Taylor et al. | ............... 546/154 |
| 5,484,943 A | 1/1996 | Zambounis et al. | ........ 548/453 |
| 5,561,232 A | 10/1996 | Hao et al. | ..................... 546/14 |
| 5,723,626 A | 3/1998 | Hao et al. | ................... 548/467 |
| 5,780,627 A | 7/1998 | Hao et al. | ..................... 544/74 |
| 5,811,543 A | 9/1998 | Hao et al. | .................... 540/123 |
| 5,840,449 A | 11/1998 | Zambounis et al. | ........... 430/7 |
| 5,874,580 A | 2/1999 | Hao et al. | ..................... 540/37 |
| 5,879,855 A | 3/1999 | Schadeli | .................. 430/270.1 |
| 5,886,160 A | 3/1999 | Hao et al. | .................... 534/733 |
| 6,184,268 B1 | * 2/2001 | Nichols et al. | |
| 6,193,792 B1 | * 2/2001 | Fague | |
| 6,210,473 B1 | * 4/2001 | Boils et al. | |
| 6,221,143 B1 | * 4/2001 | Palumbo | |

FOREIGN PATENT DOCUMENTS

| | | |
|---|---|---|
| CA | 2117860 | 4/1995 |
| EP | 648 770 | 4/1995 |
| EP | 648 817 | 4/1995 |
| EP | 742 556 | 11/1996 |
| EP | 654 711 | 6/1999 |
| JP | 04/124175 | 4/1992 |
| WO | 98/32802 | 12/1998 |

OTHER PUBLICATIONS

Abst. No. 90–202141 of JP 130366, no date avail.
Abst. No. 92–189245/23 of JP 04/124,175, no date avail.
Abst. No. 98–370632 of JP 101 47060, no date avail.

* cited by examiner

*Primary Examiner*—M. Alexandra Elve
*Assistant Examiner*—Jonathan Johnson
(74) *Attorney, Agent, or Firm*—David R. Crichton

(57) ABSTRACT

The present invention relates to a colored, preferably natural porous material comprising in its pores an effectively coloring amount of an organic pigment which is obtained by fragmenting a meltable or solvent-soluble pigment precursor in the presence of a thermally activated acid precursor, and to a low to medium temperature process for its preparation.

14 Claims, No Drawings

PIGMENTED POROUS MATERIAL

The present application relates to porous materials given coloured pigmentation with organic pigments localized in their pores and to a process for their preparation, which is characterized by the use of particular thermally activated latent catalysts.

Porous materials are commonly coloured with dyes that are applied, for example, as stains. In order to achieve satisfactory colouring results with this method a requirement is that the porous material to be coloured has a high and uniform affinity for the dye; this requirement, however, is seldom met. Porous materials coloured with dyes possess, moreover, an undesirably low light stability, and in contact with water or organic liquids (beverages, for example) marks may be formed on articles that are in contact with the materials, since the dyes are in some cases leached out again.

Another method of imparting a coloured appearance to some porous materials is to provide them with a pigmented coating. This method, however, has the disadvantage that the pores become sealed by the pigmented coating material, with the result that it becomes difficult if not impossible to perceive visually the nature of the porous material. This is a great disadvantage, especially with natural porous materials, since it is their properties, especially their natural appearance and their permeability, that are the most prized. The properties of the porous material, however, are impaired by a pigmented coating.

EP 648 770 and EP 648 817 disclose carbamate-functional, soluble chromophors which can be converted to the corresponding pigments by heating them to relatively high temperatures, with the ensuing elimination of the carbamate radicals. These compounds are suitable for the mass colouring of polymers and, according to EP 654 711, for the colouring of resists and of polymer coats to which they are applied. Compounds of the same type but with improved properties are known from EP 742 556 and WO 98/32802.

EP 654 711 also discloses the use of acids, bases and compounds capable of forming acids or bases under actinic irradiation, preferably some sulfonium salts, as catalysts.

U.S. Pat. No. 5,243,052 discloses carbonates of quinophthalones, which are of limited solubility and can be used in heat-sensitive recording systems. The leuco dye is embedded within a polymer, preferably in polyethyloxazoline.

Soluble derivatives of triphenylmethane dyes are known from U.S. Pat. No. 4,828,976. They are likewise used in heat-sensitive recording systems, together with a binder such as cellulose acetate-butyrate, polyvinylpyrrolidone or copolymerized ethylene/maleic anhydride.

EP 742 556, furthermore, describes textured pigmentary coatings which are prepared from soluble or meltable precursors and which cover all or part of a substrate surface such as fibres and fabrics. It has been found, however, that these pigmentary coatings fail to meet high requirements in terms, in particular, of their rub fastness.

Also known, finally, are numerous heat-sensitive recording systems in which colourless precursors of colorants—as solids, in the form, for example, of aqueous suspensions, together with binders and with or without fillers—are incorporated as the recording layer. For example, JP 04/123,175 describes leucoindigoid derivatives. Colorants in solid form, however, like conventional pigments, for example, make hardly any entry into the pores but for the most part remain, undesirably, on the surface.

It has now surprisingly been found that porous materials can be coloured without impairing their properties, and especially without clogging the pores, if fragmentable pigment precursors in melted or dissolved form are introduced into the pores and then converted to their insoluble pigmentary form.

Depending on the solvent, pressure, temperature and treatment time it is possible to influence to some extend the depth of penetration of the pigment precursor and so to obtain colorations wherein the pigment is more or less close to the surface. Since in this case the entirety of the pigment contributes to colouring, it is possible to reduce its amount to the minimum necessary for coloration, and the colour of the material core remains unaltered.

For other materials, it is conversely desirable to increase the penetration depth. This is especially the case with organic materials, in particular with natural organic materials wherein at least some of the pores are constituted by cells which are hardly accessible to a solution from the surface. There is a strong wish for a penetration deeper than 2 cells, for example at least 8 cells, preferably for example 20 cells or even more. However, increasing the penetration depth into many materials requires high temperatures. Consequently, porous materials which are themselves altered by heat cannot satisfactory be pigmented in depth. Adding a catalyst such as those described in the prior art in order to decrease the latent pigment's decomposition temperature moreover leads to an even lower penetration depth. This is particularly a disadvantage with naturally occurring organic porous materials such as wood, leather and hair, for example alder, amazakoe, aniegre (*Aningria altissima*), ash, balsa, beech, birch, birds eye maple, cedar, cherry, coralwood, cypress, dibaja (*Triplochiton scleroxylon*), ebony, efok (koto, tay, *Pterygota macrocarpa*), elm, eucalyptus, fir, iroko, izingana (zebrano, *Microberlinia brazzavillensis*), larch, madrona burl, mahogany, maple, movongui, myrtle, oak, obeche (*Obece scuro*), palisander (rosewood, black wood), pear, pine, poplar, sap gum, satinwood, spruce, sugar maple, sycamore, tulip, vavona, walnut or yew wood, similar wood from trees growing on other continents, lace wood, veal or pig leather, wool or camel or human hair, to mention only few natural substrates to which the invention is of course not limited.

It has now surprisingly been found, that the use of particular catalysts under appropriate conditions enables to get porous materials with uniform pigmentation right through, hence allowing them with little or no change in colour to be processed, for example cut, bent or joined—by gluing, for instance. Consequently, either finished articles or raw material, as desired, can be coloured prior to its processing or shaping.

A particularly advantageous result of the invention is an increase in production flexibility, and possibilities for making savings, when producing articles from coloured porous materials. A further great advantage is that following the colouring of the porous material its nature is, surprisingly, still apparent to the eye.

The resulting colorations are also surprisingly strong in colour, fast to weathering, light and heat, rubbing, water and solvent, and are also highly uniform optically provided the material itself is uniform in its porosity. With particular advantage this permits the use of materials whose quality would not enable any satisfactory results to be obtained on conventional colouring, a feature which, especially in the case of naturally occurring organic porous materials of complex structure, such as wood, leather or hair, for example, paves the way for ecologically significant, improved utilization of natural resources.

The present invention accordingly provides a coloured porous material comprising in its pores an effectively colouring amount of an organic pigment which is obtained by fragmenting a meltable or solvent-soluble pigment precursor, characterized in said fragmentation takes place in the presence of an effective amount of a strong acid obtained from a catalyst precursor at a temperature of from 40 to 160° C.

Said temperature is preferably from 60 to 140° C., more preferably from 80 to 120° C. The strong acid resulting from the catalyst precursor's thermal reaction has preferably a $pK_a$, of 2 or lower, most preferably a $pK_a$ of 1 or lower. No lower limit can be given for the $pK_a$, as very strong acids having largely negative or not even measurable values are well suitable. In general, an amount of from about 1 to about 100% by weight of the catalyst precursor, relative to the pigment precursor, has been found to be most adequate in the case of known pigment precursors. The amount of the catalyst precursor is most preferably from 2 to 10% by weight, relative to the pigment precursor.

Porous materials can be mineral or organic, natural, refined or synthetic. The material may, for example, be chalk, pumice, fired clay, unglazed porcelain, gypsum, concrete, kieselguhr, silica gel, zeolites, alumina, anodized aluminium, wood, paper, leather, imitation leather or hair, in whatever form, or products derived from these. It is preferably a material composed of refined or unrefined organic components of natural origin or, with particular preference, is a refined or unrefined natural organic material. In particular, it can be either hard or soft wood, leather or hair, preferably wood.

A feature of porous materials is the presence of pores, by which are meant cavities within the physical shell of the material, which may be partly or totally filled with a gas, for example air, or with a liquid, for example water. In natural organic materials, the pores are mainly constituted by cells, as well as by channels such as vascular bundles and eventually resin channels in plants or vessels and exocrine glands in leather. Materials wherein the pores extend at least in part to the surface are preferred.

The volume of the pores is preferably at least 5% relative to the volume of the geometric shell of the material. With particular preference the volume of the pores is from 20 to 90% relative to the volume of the geometric shell of the material. Preferably, the cross-section of the pores is so fine that by virtue of capillary force an aqueous liquid does not flow out under gravity. With particular preference the average cross-section of the pores is from $1 \cdot 10^{-16}$ to $10^{-6}$ m$^2$, determined at a transverse section through the material, by dividing the total pore area by the number of pores.

Introducing the pigment precursor into the pores of the porous material is effected by applying a solution or melt of the pigment precursor to the porous material using any desired, known method, for example by spraying, brushing or impregnation in a bath. The methods of and conditions for treatment of certain materials are known in the technical literature, to which express reference is hereby made. For example, the methods of and conditions for treating wood and wood products with solutions are described in detail in Ullmann's Encyclopaedia of Industrial Chemistry, Vol. A28, 305–393 (5$^{th}$ Edition 1996), or Kirk-Othmer Encyclopaedia of Chemical Technology, Vol. 24, 579–611 (3$^{rd}$ Edition 1978). Known pretreatments such as ponding (CAB Abstracts 97:143252) or treating wood chemically (Holzforschung 50/5, 449–456 (1996)) and the like may of course be applied, for example in order to increase the penetrability (A. P. Singh and B. S. Dawson, "The relationship of wood structure to coating penetrability") or the light stability (CA abstract 94:62278).

The application temperature is judiciously kept low enough for the dissolved or melted pigment precursor not to undergo any, or any significant, decomposition during the minimum time required for the application, and also lower than the temperature at which the catalyst precursor reacts to a strong acid. If desired, the solution or melt of the pigment precursor may be augmented with further substances known for treating the material, examples being fungicides, antibiotics, flame retardants or moisture repellents.

Suitable solvents are water or, preferably, any desired protic or aprotic solvents, examples being hydrocarbons, alcohols, amides, nitrites, nitro compounds, N-heterocycles, ethers, ketones and esters which may also be either mono- or polyunsaturated or chlorinated: examples are methanol, ethanol, isopropanol, diethyl ether, acetone, methyl ethyl ketone, 1,2-dimethoxyethane, 1,2-diethoxyethane, 2-methoxyethanol, ethyl acetate, tetrahydrofuran, dioxane, acetonitrile, benzonitrile, nitrobenzene, N,N-dimethylformamide, N,N-dimethylacetamide, dimethyl sulfoxide, N-methylpyrrolidone, pyridine, picoline, quinoline, trichloroethane, benzene, toluene, xylene, anisole and chlorobenzene. Further examples of solvents are described in numerous tabular and reference works. Instead of a single solvent it is also possible to employ mixtures of two or more solvents.

Preference is given to those solvents which do neither corrode, nor extract significant amounts of any essential substance from the substrate that is to be coloured, or do so only very slowly, and which have a boiling point of from 40 to 160° C., especially to aromatic hydrocarbons, alcohols, ethers, ketones and esters. Particular preference is given to toluene, methanol, ethanol, isopropanol, 1,2-dimethoxyethane, 1,2-diethoxyethane, 1-methoxy-2-propanol, acetone, methyl ethyl ketone, ethyl acetate, tetrahydrofuran and dioxane, and mixtures thereof. The solvent may also be chosen in order to simultaneously provide a preservative treatment (Holz als Roh- und Werkstoff 56/4, 247–251 (1998)).

The concentration of the pigment precursor in water or a solvent is usually from 0.01% by weight, based on the weight of the solution, to approximately 99% by weight of the saturation concentration, it also being possible in certain cases to employ supersaturated solutions without premature precipitation of the solvate. For many pigment precursors the optimum concentration is around ~0.05–10% by weight, often around 0.1–5% by weight, based on the weight of the solution.

Conversion of the pigment precursor into the pigmentary form takes place by thermal fragmentation in the presence of a strong acid thermally produced by the instant catalyst precursor. The pigment precursor's fragmentation temperature is in the same range as the catalyst precursor's reaction to a strong acid, adequately from 40 to 160° C., preferably from 60 to 140° C., most preferably from 80 to 120° C. Fragmentation can be carried out individually, or simultaneously with any further known, subsequent treatment; for example, in the course of curing an additional transparent coating film.

The catalyst precursor is adequately not a strong acid itself. Preferably, the catalyst precursor has a $pK_a > 2$, most preferably a $PK_a \geq 5$.

Preferred catalyst precursors are of formula

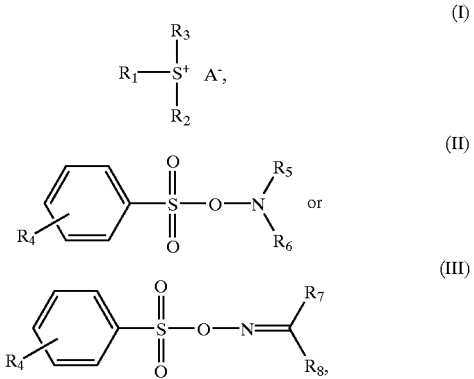

wherein
$R_1$, $R_2$ and $R_3$ are independently from one another $C_1$–$C_{24}$alkyl, $C_6$–$C_{24}$aryl or $C_7$–$C_{24}$aralkyl,
$R_4$ is $C_1$–$C_{24}$alkyl,
$R_5$, $R_6$, $R_7$ and $R_8$ are independently from one another $C_1$–$C_{24}$alkyl, $C_6$–$C_{24}$aryl or $C_7$–$C_{24}$aralkyl,
or $R_5$ and $R_6$ together or $R_7$ and $R_8$ together are $C_4$–$C_{24}$alkylen, $C_4$–$C_{24}$aralkylen, 3-oxa-pentylen or N—$C_1$–$C_{24}$alkyl-3-aza-pentylen,
A is $PX_6$, $AsX_6$, $SbX_6$, $BX_4$, $R_9$—$SO_3$, $R_9$—$OSO_3$ or $R_{10}$—$PO_3R_{11}$, wherein $R_9$, $R_{10}$ and $R_{11}$ are independently from one another $C_1$–$C_{24}$alkyl, $C_6$–$C_{24}$aryl or $C_7$–$C_{24}$aralkyl. $R_{10}$ and $R_{11}$ are preferably $C_1$–$C_{24}$alkyl, most preferably $C_1$–$C_4$alkyl, particularly methyl, and X is halogen.

Further substituents may be present in the compounds of formulae (I), (II) and (III), for example halogen atoms or nitro or $C_1$–$C_{24}$alkoxy groups.

Most preferred catalyst precursors are of formula

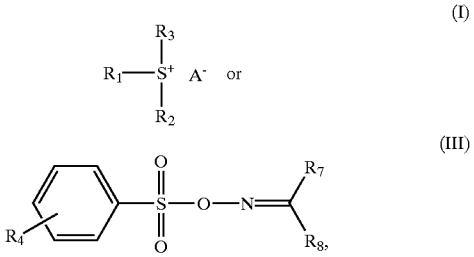

It is believed that at least part of the catalyst precursor penetrates into the pores in substantially unchanged form. The strong acid is then obtained thermally within the pores and is immediately available to catalyse the pigment's regeneration from the pigment precursor, so that it does not need to be stable.

Surprisingly, the presence of the strong acid or its subsequent products does not lead to any negative side effects such as impairing the porous material's properties, although such effects would have been expected. It is however nevertheless preferred to keep the amount of the acid precursor at optimal level, so that the pigment precursor is converted back to the pigment at a tame rate. There is a correlation between the acid precursor concentration, the acid strength and the optimal conversion's temperature and duration: the higher the acid precursor concentration and/or the acid's $pK_a$, the lower the temperature and/or the shorter the reaction time, and conversely.

By an effectively colouring amount is meant that amount which is sufficient to bring about a colour difference $\Delta E^*$ (CIE-L*a*b*) of $\geq 2$: when the coloured material is compared with the uncoloured material under the standard illuminant $D_{65}$ and at a viewing angle of 10°. This amount is preferably from 0.01 to 30% by weight, most preferably from 0.1 to 15% by weight, based on the weight of the coloured material.

Judicious fragmentable pigment precursors are those whose structure includes a complete pigment framework substituted on at least one heteroatom N, O or S. The substituent involved is preferably an oxycarbonyl radical. Where the heteroatom is part of the chromophor or bonded directly to the chromophore, in the course of fragmentation the oxycarbonyl radical is generally eliminated and replaced by a hydrogen atom, so that the structure of the resulting pigment corresponds to that of the unsubstituted pigment framework. Where, on the other hand, the heteroatom is bonded to a substituent of the chromophor, then the fragmentation process is sometimes more complex, and the precise structure of the resulting pigment cannot always be clearly ascertained.

The pigment precursors can be employed individually or else in mixtures with other pigment precursors or with colorants—for example, dyes customary for the corresponding application. Where the pigment precursors are employed in mixtures, the components of the mixture are preferably those whose colour in the pigmentary form is red, violet, yellow, blue, brown or black. From these it is possible to produce brown shades having a particularly natural occurrence. Any dyes added are likewise preferably red, violet, yellow, blue, brown or black.

For obtaining brown shades, it is particularly preferred to use either a single brown disazo condensation pigment precursor or more particularly preferred mixtures of a yellow disazo condensation pigment precursor, a bluish red Naphthol AS pigment precursor and a blue copper phthalocyanine pigment precursor which is substituted with 1 to 4 sulfonamido groups at peripheric positions of the phthalocyanine's phenyl rings. Bluish red is a wide colour range comprising also colours for which sometimes other designations are used, such as for example magenta, ruby, claret, cabernet, maroon and violet.

In general, brown is a colour of $C^*$ value from 5 to 35, preferably from 10 to 30, and $H^*$ value of from 0 to 90, preferably from 20 to 70, especially from 45 to 60 (CIE 1976 color space).

Hence, the application also relates to a coloured porous material comprising in its pores an effectively colouring amount of an organic pigment or a combination of organic pigments each obtained by fragmenting a meltable or solvent-soluble pigment precursor, characterized in said porous material has a brown pigmentation which consists essentially of a brown disazo condensation pigment or a mixture of a yellow disazo condensation pigment, a bluish red Naphthol AS pigment and a blue copper phthalocyanine pigment which is substituted with 1 to 4 sulfonamido groups at peripheric positions of its phenyl rings.

Preferred pigment precursors are, for example, compounds of the formula (IV)

$$A(B)_x \qquad (IV),$$

in which
x is an integer from 1 to 8,
A is the radical of a chromophor of the quinacridone, anthraquinone, perylene, indigo, quinophthalone, indanthrone, isoindolinone, isoindoline, dioxazine, azo, phthalocyanine or diketopyrrolopyrrole series which is attached to x groups B via one or more heteroatoms selected from the group consisting of N, O and S and forming part of the radical A, B is hydrogen or a group of the formula

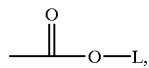

where at least one group B is not hydrogen and, if x is from 2 to 8, the groups B can be identical or different, and L is any suitable solubilizing group, for example tert.-butyl or tert.-amyl. Many other groups suitable for solubilizing pigments are known, for example, from the publications referred to above.

Except in the case of phthalocyanines, A preferably contains at least one directly adjacent or conjugated carbonyl group at each heteroatom attached to x groups B.

A is the radical of known chromophores having the basic structure $A(H)_x$. Examples of compounds of formula (IV) are known for example from WO 98/32802, WO 98/45756, WO 98/45757, WO 98/58027, WO 99101511 and from the application PCT/EP-99/06653 (partially yet unpublished at the instant application's date), as well as from many other publications cited therein, the contents of all are expressly incorporated herein by reference.

Preferred compounds of formula (IV) are those disclosed as preferred in WO 98/32802 and WO 98/58027. Particularly noteworthy soluble chromophores of formula (IV) are those which can be prepared from Colour Index Pigment Yellow 13, Pigment Yellow 73, Pigment Yellow 74, Pigment Yellow 83, Pigment Yellow 93, Pigment Yellow 94, Pigment Yellow 95, Pigment Yellow 109, Pigment Yellow 110, Pigment Yellow 120, Pigment Yellow 128, Pigment Yellow 139, Pigment Yellow 151, Pigment Yellow 154, Pigment Yellow 175, Pigment Yellow 180, Pigment Yellow 181, Pigment Yellow 185, Pigment Yellow 194, Pigment Orange 31, Pigment Orange 71, Pigment Orange 73, Pigment Red 122, Pigment Red 144, Pigment Red 166, Pigment Red 184, Pigment Red 185, Pigment Red 202, Pigment Red 214, Pigment Red 220, Pigment Red 221, Pigment Red 222, Pigment Red 242, Pigment Red 248, Pigment Red 254, Pigment Red 255, Pigment Red 262, Pigment Red 264, Pigment Brown 23, Pigment Brown 41, Pigment Brown 42, Pigment Blue 25, Pigment Blue 26, Pigment Blue 60, Pigment Blue 64, Pigment Violet 19, Pigment Violet 29, Pigment Violet 32, Pigment Violet 37, 3,6-di(4'-cyanophenyl)-2,5-dihydro-pyrrolo[3,4-c]pyrrole-1,4-dione and 3-phenyl-6-(4'-tert-butyl-phenyl)-2,5-dihydro-pyrrolo[3,4-c]pyrrole-1,4-dione.

The compounds of the formula (IV) are known or can be prepared in analogy to methods known per se, as described, for example, in EP 648 770, EP 648 817 and EP 742 556.

Preferably —L is a group of the formula

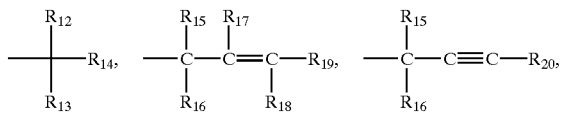

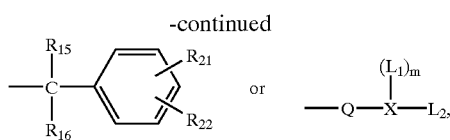

in which $R_{12}$, $R_{14}$ and $R_{13}$ independently of one another are $C_1$–$C_6$alkyl, $R_{15}$ and $R_{16}$ independently of one another are $C_1$–$C_6$alkyl, O, S or $N(R_{23})_2$-interrupted $C_1$–$C_6$alkyl, unsubstituted or $C_1$–$C_6$alkyl-, $C_1$–$C_6$alkoxy-, halo-, cyano- or nitro-substituted phenyl or biphenylyl, $R_{17}$, $R_{18}$ and $R_{19}$ independently of one another are hydrogen or $C_1$–$C_6$alkyl, $R_{20}$ is hydrogen, $C_1$–$C_6$alkyl or a group of the formula

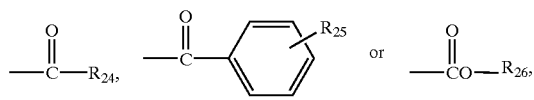

$R_{21}$ and $R_{22}$ independently of one another are hydrogen, $C_1$–$C_6$alkyl, $C_1$–$C_6$alkoxy, halogen, cyano, nitro, $N(R_{23})_2$, unsubstituted or halo-, cyano-, nitro-, $C_1$–$C_6$alkyl- or $C_1$–$C_6$alkoxy-substituted phenyl, $R_{23}$ and $R_{24}$ are $C_1$–$C_6$alkyl, $R_{25}$ is hydrogen or $C_1$–$C_6$alkyl and $R_{26}$ is hydrogen, $C_1$–$C_6$alkyl, unsubstituted or $C_1$–$C_6$alkyl-substituted phenyl, Q is p,q-$C_2$–$C_6$alkylene which is unsubstituted or substituted one or more times by $C_1$–$C_6$alkoxy, $C_1$–$C_6$alkylthio or $C_2$–$C_{12}$dialkylamino, p and q being different numeric locants, X is a heteroatom selected from the group consisting of N, O and S, where m is 0 if X is O or S and is 1 if X is N, and $L_1$ and $L_2$ independently of one another are unsubstituted or mono- or poly-$C_1$–$C_{12}$alkoxy-, —$C_1$–$C_{12}$alkylthio-, —$C_2$–$C_{24}$dialkylamino-, —$C_6$–$C_{12}$aryloxy-, —$C_6$–$C_{12}$arylthio-, —$C_7$–$C_{24}$alkylarylamino- or —$C_{12}$–$C_{24}$diarylamino-substituted $C_1$–$C_6$alkyl or [-(p', q'—$C_2$–$C_6$alkylene)—Z—]$_n$—$C_1$–$C_6$alkyl, where n is a number from 1 to 1000, p' and q' are different numeric locants, each Z independently of the others is a heteroatom O, S or $C_1$–$C_{12}$alkyl-substituted N, and $C_2$–$C_6$alkylene in the repeating units [—$C_2$–$C_6$alkylene-Z—] can be identical or different, and $L_1$ and $L_2$ can be saturated or mono- to deca-unsaturated, uninterrupted or interrupted in any desired points by from 1 to 10 groups selected from the group consisting of —(C=O)— and —$C_6H_4$—, and may carry no or 1 to 10 further substituents selected from the group consisting of halogen, cyano and nitro.

Of particular interest are compounds of the formula (IV) in which L is $C_1$–$C_6$alkyl or

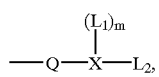

in which Q is $C_2$–$C_4$alkylene and $L_1$ and $L_2$ are [—$C_2$–$C_{12}$alkylene-Z—]$_n$—$C_1$–$C_{12}$alkyl or are $C_1$–$C_{12}$alkyl which is substituted one or more times by $C_1$–$C_{12}$alkoxy, $C_1$–$C_{12}$alkylthio or $C_2$–$C_{24}$dialkylamino, and m and n are as defined above.

Of very particular interest are compounds of the formula (IV) in which L is $C_4$–$C_5$alkyl (especially tert.-butyl or tert.-amyl) or

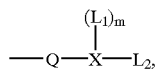

in which Q is $C_2$–$C_4$alkylene, X is O and m is zero, and $L_2$ is [—$C_2$–$C_{12}$alkylene-O—]$_n$—$C_1$–$C_{12}$alkyl or is $C_1$–$C_{12}$alkyl which is substituted one or more times by $C_1$–$C_{12}$alkoxy, especially those in which —Q—X— is a group of the formula —C(CH$_3$)$_2$—CH$_2$—O—.

Alkyl or alkylene can be straight-chain, branched, monocyclic or polycyclic.

Thus $C_1$–$C_{12}$alkyl is, for example, methyl, ethyl, n-propyl, isopropyl, n-butyl, sec-butyl, isobutyl, tert-butyl, cyclobutyl, n-pentyl, 2-pentyl, 3-pentyl, 2,2-dimethylpropyl, cyclopentyl, cyclohexyl, n-hexyl, n-octyl, 1,1,3,3-tetramethylbutyl, 2-ethylhexyl, nonyl, trimethylcyclohexyl, decyl, menthyl, thujyl, bornyl, 1-adamantyl, 2-adamantyl or dodecyl.

If $C_2$–$C_{12}$alkyl is mono- or polyunsaturated it is $C_2$–$C_{12}$alkenyl, $C_2$–$C_{12}$alkynyl, $C_2$–$C_{12}$alkapolyenyl or $C_2$–$C_{12}$alkapolyynyl in which two or more double bonds may if appropriate be isolated or conjugated, examples being vinyl, allyl, 2-propen-2-yl, 2-buten-1-yl, 3-buten-1-yl, 1,3-butadien-2-yl, 2-cyclobuten-1-yl, 2-penten-1-yl, 3-penten-2-yl, 2-methyl-1-buten-3-yl, 2-methyl-3-buten-2-yl, 3-methyl-2-buten-1-yl, 1,4-pentadien-3-yl, 2-cyclopenten-1-yl, 2-cyclohexen-1-yl, 3-cyclohexen-1-yl, 2,4-cyclohexadien-1-yl, 1-p-menthen-8-yl, 4(10)-thujen-10-yl, 2-norbornen-1-yl, 2,5-norbornadien-1-yl, 7,7-dimethyl-2,4-norcaradien-3-yl or the various isomers of hexenyl, octenyl, nonenyl, decenyl or dodecenyl.

$C_2$–$C_4$alkylene is, for example, 1,2-ethylene, 1,2-propylene, 1,3-propylene, 1,2-butylene, 1,3-butylene, 2,3-butylene, 1,4-butylene or 2-methyl-1,2-propylene. $C_5$–$C_{12}$alkylene is, for example, an isomer of pentylene, hexylene, octylene, decylene or dodecylene.

$C_1$–$C_{12}$alkoxy is O—$C_1$–$C_{12}$alkyl, preferably O—$C_1$–$C_4$alkyl.

$C_6$–$C_{12}$aryloxy is O—$C_8$–$C_{12}$aryl, for example phenoxy or naphthoxy, preferably phenoxy.

$C_1$–$C_{12}$alkylthio is S—$C_1$–$C_{12}$alkyl, preferably S—$C_1$–$C_4$alkyl.

$C_6$–$C_{12}$arylthio is S—$C_6$–$C_{12}$aryl, for example phenylthio or naphthylthio, preferably phenylthio.

$C_2$–$C_{24}$dialkylamino is N(alkyl$_1$)(alkyl$_2$), where the sum of the carbon atoms in the two groups alkyl$_1$ and alkyl$_2$ is from 2 to 24, preferably N($C_1$–$C_4$alkyl)—$C_1$–$C_4$alkyl.

$C_7$–$C_{24}$alkylarylamino is N(alkyl$_1$)(aryl$_2$), where the sum of the carbon atoms in the two groups alkyl$_1$ and aryl$_2$ is from 7 to 24, for example methylphenylamino, ethylnaphthylamino or butylphenanthrylamino, preferably methylphenylamino or ethylphenylamino.

$C_{12}$–$C_{24}$diarylamino is N(aryl$_1$)(aryl$_2$), where the sum of the carbon atoms in the two groups aryl$_1$ and aryl$_2$ is from 12 to 24, for example diphenylamino or phenylnaphthylamino, preferably diphenylamino.

$C_6$–$C_{16}$aryl ist for example phenyl, naphthyl, anthracenyl, pyrenyl or naphthacenyl.

$C_7$–$C_{24}$aralkyl ist any group comprising at least each an alkyl and an aryl part, for example benzyl, phenethyl, tolyl, dodecylphenyl, indanyl or acenaphtenyl.

Halogen is chlorine, bromine, fluorine or iodine, preferably fluorine or chlorine, most preferably fluorine.

n is preferably a number from 1 to 100, with particular preference a number from 2 to 12.

In addition to the pigment, the porous material may also contain other compounds in its pores, for example binders or surfactants known in the art to improve the pigment's dispersibility or compounds known in the art to improve the material's properties such as UV absorbers or water-repellent compounds.

The invention also provides a process for preparing a coloured porous material whose pores comprise an effectively colouring amount of an organic pigment, comprising (a) the treatment of a porous material with a solution or melt of a pigment precursor also comprising an effective amount of a strong acid obtained from a catalyst precursor at a temperature of from 40 to 160° C., at a temperature lower than the temperature at which said catalyst precursor reacts thermally to produce said strong acid, such that at least part of the pigment precursor enters the pores of the material, and (b) the fragmentation of the pigment precursor that has entered the pores of the material in accordance with treatment (a), to form a pigment, by means of heating or irradiation to a temperature of from 40 to 160° C. at which said catalyst precursor reacts thermally to produce said strong acid.

Heating or irradiation step can be carried out by any desired thermal means; for example, by treatment in a thermal oven or by electromagnetic radiation, for example IR or NIR radiation, or microwaves.

Of course, it is judicial to choose a temperature which is lower than the decomposition or alteration point of the porous material to be pigmented, so that fragmentation can be accomplished without altering the material's properties. Thus, step (b) is usually adequately accomplished by heating to a temperature of from 40 to 160° C., preferably from 60 to 140° C., most preferably from 80 to 120° C., or by irradiating with an amount of energy sufficient for said pigment precursor to be heated to said temperature.

The heating time is not critical, as long as care is taken that it is sufficiently long for the fragmentation of the pigment precursor to be completed. Typically, it ranges from several seconds to several hours, preferably from about 1 to about 30 minutes. The required heating time is suitably increased if a temperature below 100° C. is intended to be used.

In addition to the steps (a) and (b), the process may of course comprise additional steps which are known per se, for example a prior ponding or bleaching and/or a subsequent impregnating or overcoating with, for example, a colourless nitrocellulose lacquer.

When the porous material also contains other compounds in its pores, it is preferred to add the latter at the latest before step (b), most preferred before step (a).

The examples which follow illustrate the invention, without limiting its scope.

Structures of Pigment Precursors
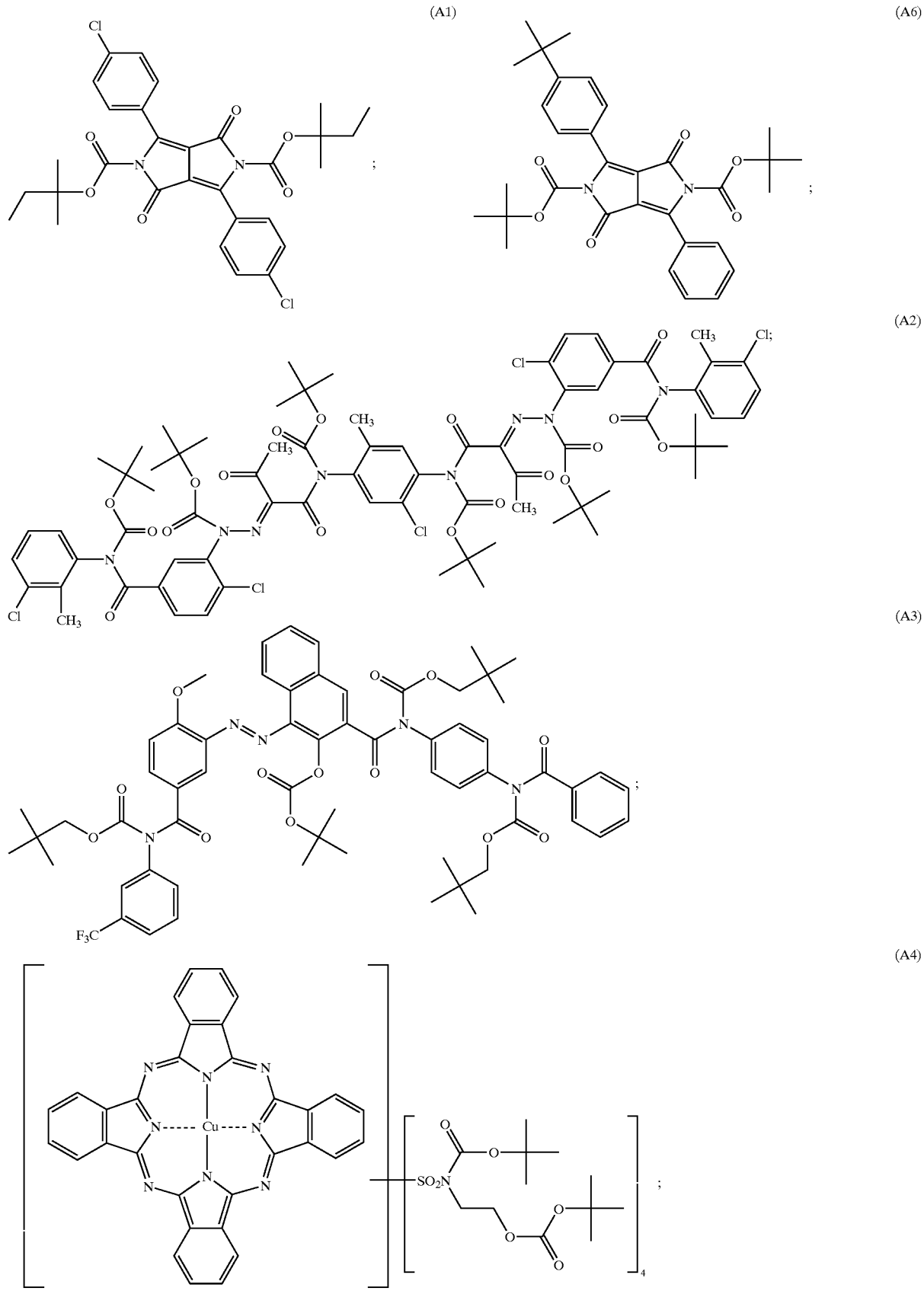

-continued

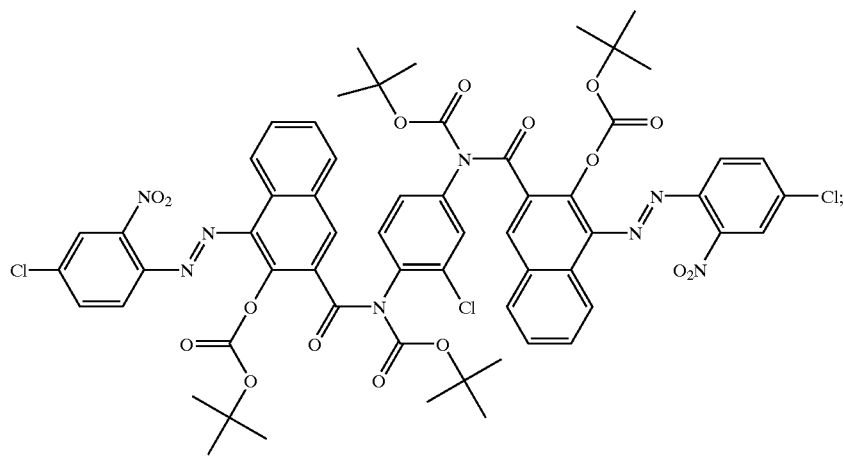
(A5)

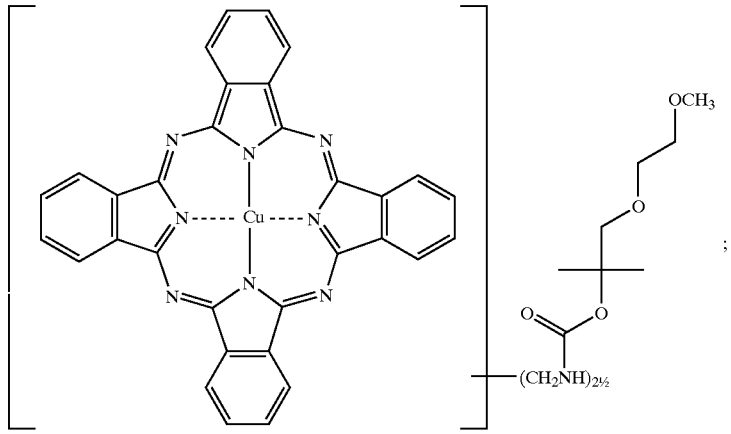
[WO-98/32802-example 15]
(A7)

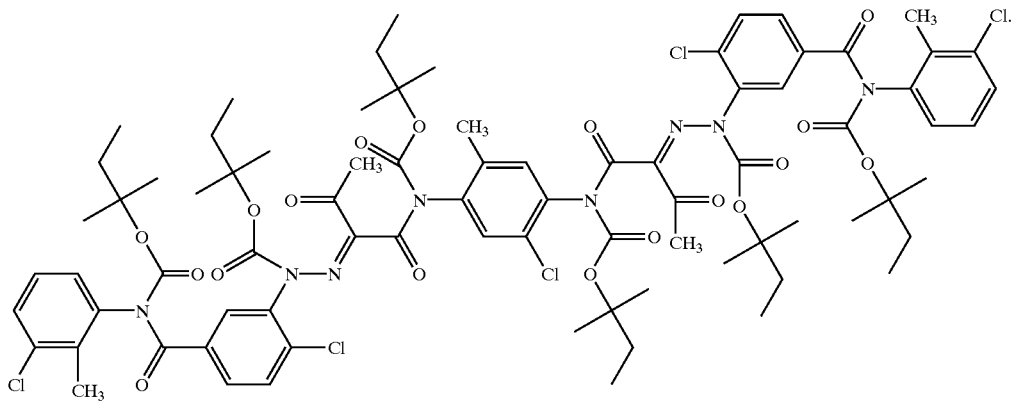
(A8)

Preparation of compound A4: The first step is analogous to example 1 of WO 98/45756; by using less chlorosulfonic acid, it is easy to obtain similarly compounds, respectively mixtures thereof, having from 1 to 4 sulfonic groups; these homologues can be transformed into equally useful pigment precursors in close analogy to the following procedure. Chlorosulfonic acid (105 ml) is added dropwise to copper phthalocyanine (25.0 g) under ice cooling keeping the temperature below 50° C. The mixture is heated gradually to 145° C. over 45 minutes, at which temperature it is stirred for 3½ hours. After cooling to 80° C., thionyl chloride (32.5 ml) is added in portions over 25 minutes, whilst the temperature is kept at 70–80° C. After stirring for 3½ hours at 80–85° C. and 16 hours at 23° C., the mixture is poured onto ice-water (4 l) and the precipitate filtered under reduced pressure and washed with water (4 l).

The thus obtained blue paste is dried for 30 minutes prior to use in the next step, then dissolved in tetrahydrofuran (800 ml). A solution of ethanolamine (60 ml) in tetrahydrofuran (200 ml) is added dropwise over 45 min while maintaining the temperature below 30° C. The reaction mixture is then heated up to 64° C., refluxed for 16 hours and concentrated under reduced pressure after cooling to 23° C. After addition of dilute hydrochloric acid (0.5 M, 1.5 l), the precipitated product is filtered off, washed with dilute hydrochloric acid (0.5 M, 0.5 l) and dried at 95° C./130 mbar to yield the pigment (42.0 g, 90.6% of th.).

Analysis [%]: ($C_{40}H_{36}N_{12}O_{12}S_4Cu.2.45\ H_2O$) calc. C, 43.18; H, 3.70; N, 15.11; S, 11.53; Cu, 5.71; $H_2O$, 3.97. found C, 43.38; H, 3.64; N, 14.65; S, 10.99; Cu, 5.65; $H_2O$, 3.96.

To a suspension of this pigment (5.0 g) in tetrahydrofuran (140 ml) is added 4-dimethylaminopyridine (0.66 g) and di-t-butyl-pyrocarbonate (11.4 g); the resulting mixture is stirred 16 hours at 23° C. After filtration on Hyflo Super-Cel® (40 g), then on silica (140 g) (eluent tetrahydrofuran; 600 ml), the solution is concentrated under reduced pressure. Precipitation by addition of n-hexane (500 ml), followed by filtration and washing with n-hexane affords the compound of formula (A4) as a blue powder which is dried at 20° C. and 130 mbar (7.4 g, 84.2% of th.).

Analysis [%]: ($C_{80}H_{100}N_{12}O_{28}S_4Cu.0.5\ H_2O$) calc. C, 51.15; H, 5.42; N, 8.95; S, 6.83; Cu, 3.38; $H_2O$, 0.48. found C, 50.92; H, 5.04; N, 9.66; S, 7.00; Cu, 3.59; $H_2O$, 0.48.

UV/VIS ($CH_2Cl_2$): $\lambda_{max}$=672.3 nm ($\epsilon$=140'500).

Thermogravimetric analysis (0–400° C., 10° C./min): calc. weight loss 42.8% found weight loss 42.08% (peak at 177.0° C.)

Structures of Catalyst Precursors

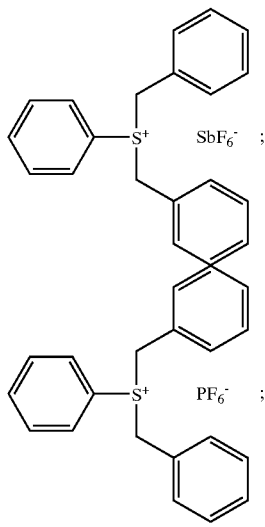

(B1)

(B2)

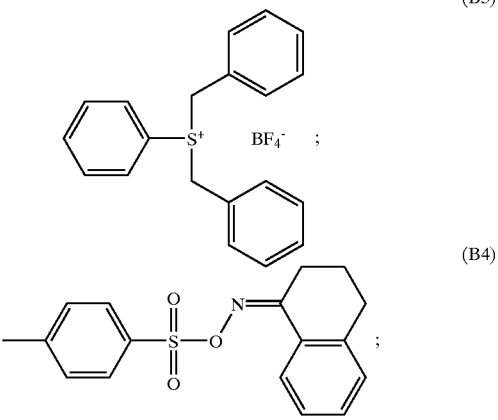

(B3)

(B4)

Nacure® 5225 (King Industries, amine-blocked dodecylbenzene sulphonate) (B5);
Nacure® 5925 (King Industries, amine-blocked dodecylbenzene sulphonate) (B6);
Nacure® 2530 (King Industries, amine-blocked p-toluene sulphonate) (B7).

EXAMPLE 1

A 100×252×1 mm piece of obeche wood stored at 40% residual moisture content is steeped in a solution of 1.3 g pigment precursor (A1) and 0.5 g catalyst precursor (B1) in 100 ml of ethyl acetate for 18 hours at 25° C. It is then left to dry in the air for 30 minutes, and is subsequently heated at 120° C. for 30 minutes. A red wooden sheet is obtained which is homogeneously coloured through, has good fastness properties, and the structure of which corresponds, both optically and to the touch, to that of natural wood.

EXAMPLE 2

A 100×252×1 mm piece of ash wood stored at 40% residual moisture content is sprayed thrice with a solution of 1 g pigment precursor (A1) and 1 g catalyst precursor (B1) in 100 ml of ethyl acetate at 25° C. It is then left to dry in the air for 30 minutes, and is subsequently heated at 120° C. for 30 minutes. A red coloured wooden sheet similar to that of example 1 is obtained.

EXAMPLES 3–14

The procedure of Examples 1–2 is used, with the difference that the following catalyst precursors are used in the following quantities, and the solvent and the final heating temperature is varied:

| example | 3 | 4 | 5 | 6 | 7 | 8 | 9 | 10 | 11 | 12 | 13 | 14 |
| --- | --- | --- | --- | --- | --- | --- | --- | --- | --- | --- | --- | --- |
| wood | obeche | | | | | | ash | | | | | |
| solvent | ethyl acetate | | | ethylmethylketone | | | ethyl acetate | | | ethylmethylketone | | |
| cat. precursor | B2 | B3 | B4 | B5 | B6 | B7 | B2 | B3 | B4 | B5 | B6 | B7 |
| quantity [g] | 0.02 | 0.08 | 0.25 | 0.7 | 1.0 | 1.3 | 0.15 | 0.8 | 1 | 0.04 | 0.6 | 0.4 |
| final temp. [° C.] | 130 | 150 | 140 | 140 | 140 | 140 | 130 | 150 | 140 | 140 | 140 | 140 |

In all cases, in-depth red colorations having good properties are obtained.

EXAMPLES 15–26

The procedure of Examples 1–2 is used, with the difference that 10.0 g of pigment precursor (A2) is used instead of pigment precursor (A1) and the following catalyst precursors are used in the following quantities, and the solvent and the final heating temperature are varied:

| example | 15 | 16 | 17 | 18 | 19 | 20 | 21 | 22 | 23 | 24 | 25 | 26 |
|---|---|---|---|---|---|---|---|---|---|---|---|---|
| wood | obeche | | | | | | ash | | | | | |
| solvent | ethyl acetate | | | ethylmethylketone | | | ethyl acetate | | | ethylmethylketone | | |
| cat. precursor | B1 | B2 | B3 | B4 | B6 | B7 | B1 | B2 | B3 | B4 | B5 | B7 |
| quantity [g] | 5 | 2 | 1 | 10 | 0.5 | 3 | 1 | 3 | 0.5 | 5 | 2 | 10 |
| final temp. [° C.] | 120 | 120 | 150 | 140 | 140 | 140 | 120 | 120 | 150 | 140 | 140 | 140 |

In all cases, in-depth yellow colorations having good properties are obtained.

EXAMPLES 27–38

The procedure of Examples 1–2 is used, with the difference that 3.0 g of pigment precursor (A3) is used instead of pigment precursor (A1), 0.5 g of the following catalyst precursors is used, and the solvent and the final heating temperature are varied:

| example | 27 | 28 | 29 | 30 | 31 | 32 | 33 | 34 | 35 | 36 | 37 | 38 |
|---|---|---|---|---|---|---|---|---|---|---|---|---|
| wood | obeche | | | | | | ash | | | | | |
| solvent | ethyl acetate | | | ethylmethylketone | | | ethyl acetate | | | ethylmethylketone | | |
| cat. precursor | B1 | B2 | B4 | B3 | B6 | B7 | B1 | B2 | B4 | B3 | B5 | B6 |
| final temp. [° C.] | 120 | 130 | 140 | 150 | 140 | 140 | 120 | 130 | 140 | 150 | 140 | 140 |

In all cases, in-depth magenta colorations having good properties are obtained.

EXAMPLES 39–50

The procedure of Examples 1–2 is used, with the difference that 3.8 g of pigment precursor (A4) is used instead of pigment precursor (A1) and the following catalyst precursors are used in the following quantities, and the solvent and the final heating temperature are varied:

| example | 39 | 40 | 41 | 42 | 43 | 44 | 45 | 46 | 47 | 48 | 49 | 50 |
|---|---|---|---|---|---|---|---|---|---|---|---|---|
| wood | obeche | | | | | | ash | | | | | |
| solvent | ethyl acetate | | | ethylmethylketone | | | ethyl acetate | | | ethylmethylketone | | |
| cat. precursor | B1 | B2 | B4 | B5 | B6 | B7 | B1 | B2 | B3 | B5 | B6 | B7 |
| quantity [g] | 1 | 3.5 | 2 | 2.5 | 0.5 | 1.5 | 1.5 | 3.5 | 0.5 | 2.5 | 2 | 1 |
| final temp. [° C.] | 120 | 120 | 140 | 140 | 140 | 140 | 120 | 120 | 150 | 140 | 140 | 140 |

In all cases, in-depth blue colorations having good properties are obtained.

EXAMPLES 51–62

The procedure of Examples 1–2 is used, with the difference that 3 g of pigment precursor (A5) is used instead of pigment precursor (A1) and the following catalyst precursors are used in the following quantities, and the solvent and the final heating temperature are varied:

| example | 51 | 52 | 53 | 54 | 55 | 56 | 57 | 58 | 59 | 60 | 61 | 62 |
|---|---|---|---|---|---|---|---|---|---|---|---|---|
| wood | obeche | | | | | | ash | | | | | |
| solvent | ethyl acetate | | | ethylmethylketone | | | ethyl acetate | | | ethylmethylketone | | |
| cat. precursor | B2 | B3 | B4 | B5 | B6 | B7 | B2 | B3 | B4 | B5 | B6 | B7 |
| quantity [g] | 0.1 | 2 | 2.5 | 0.03 | 0.5 | 3 | 0.25 | 0.5 | 2 | 3 | 0.1 | 0.03 |
| final temp. [° C.] | 130 | 150 | 140 | 140 | 140 | 140 | 130 | 150 | 140 | 140 | 140 | 140 |

In all cases, in-depth brown colorations having good properties are obtained.

EXAMPLES 63–74

The procedure of Examples 1–2 is used, with the difference that a mixture of 1.3 g of pigment precursor (A2), 1.3 g of pigment precursor (A3) and 0.4 g of pigment precursor (A4) is used instead of pigment precursor (A1) and the following catalyst precursors are used in the following quantities, and the solvent and the final heating temperature are varied:

| example | 63 | 64 | 65 | 66 | 67 | 68 | 69 | 70 | 71 | 72 | 73 | 74 |
|---|---|---|---|---|---|---|---|---|---|---|---|---|
| wood | obeche | | | | | | | | ash | | | |
| solvent | ethyl acetate | | ethylmethylketone | | | | ethyl acetate | | ethylmethylketone | | | |
| cat. precursor | B2 | B3 | B4 | B5 | B6 | B7 | B2 | B3 | B4 | B5 | B6 | B7 |
| quantity [g] | 2 | 0.1 | 2.5 | 0.03 | 0.5 | 3 | 0.25 | 0.5 | 2 | 3 | 0.1 | 0.03 |
| final temp. [° C.] | 120 | 150 | 140 | 140 | 140 | 140 | 130 | 150 | 140 | 140 | 140 | 140 |

In all cases, in-depth brown colorations having good properties are obtained.

EXAMPLES 75–111

The procedure of Examples 1, 3–8, 15–20, 27–32, 39–44, 51–56 and 63–68 is used, with the difference that the treatment temperature is increased to 40° C. and the treatment time is reduced to 12 h. In all cases, in-depth colorations having good properties are obtained.

EXAMPLES 112–148

The procedure of Examples 75–111 is used, with the difference that the treatment temperature is increased to 60° C. and the treatment time is reduced to 4 h. In all cases, in-depth colorations having good properties are obtained.

EXAMPLE 150

The procedure of Example 33 is used, with the difference that 0.1 g of catalyst precursor B1 is used and the regeneration temperature is increased to 160° C. After heating, the pigmented samples are steeped in ethyl acetate for 20 minutes. The surrounding liquid is absolutely colorless, demonstrating that the conversion to the pigmentary state is complete.

EXAMPLE 151

The procedure of Example 150 is used, with the difference that the regeneration temperature is decreased to 140° C. The surrounding liquid is nearly colorless, demonstrating that the conversion to the pigmentary state is almost complete.

EXAMPLE 152

The procedure of Example 150 is used, with the difference that 1 g of catalyst precursor B1 is used and the regeneration temperature is decreased to 140° C. The surrounding liquid is absolutely colorless, demonstrating that the conversion to the pigmentary state is complete.

EXAMPLE 153

The procedure of Example 152 is used, with the difference that the regeneration temperature is decreased to 120° C. The surrounding liquid is nearly colorless, demonstrating that the conversion to the pigmentary state is almost complete.

EXAMPLE 154

The procedure of Example 150 is used, with the difference that 2 g of catalyst precursor B1 is used and the regeneration temperature is decreased to 120° C. The surrounding liquid is absolutely colorless, demonstrating that the conversion to the pigmentary state is complete.

EXAMPLE 155

The procedure of Example 154 is used, with the difference that the regeneration temperature is decreased to 100° C. The surrounding liquid is nearly colorless, demonstrating that the conversion to the pigmentary state is almost complete.

EXAMPLE 156

The procedure of Example 150 is used, with the difference that 3 g of catalyst precursor B1 is used and the regeneration temperature is decreased to 80° C. The surrounding liquid is absolutely colorless, demonstrating that the conversion to the pigmentary state is complete.

Examples 150 to 156 show that a higher concentration of catalyst precursor enables to regenerate the pigment at a considerably lower temperature. The skilled artisan can easily choose the optimal concentration depending on the desired temperature.

EXAMPLES 157–158

The procedure of Example 33 is used, with the difference that poplar and fir is used instead of obeche. After heating, the pigmented samples are steeped in ethyl acetate for 30 minutes. The surrounding liquid is absolutely colorless, demonstrating that the conversion to the pigmentary state is complete.

EXAMPLES 159–161

The procedure of Examples 33, 157 and 158 is used, with the difference that pigment precursor (A6) is used instead of pigment precursor (A3). After heating, the pigmented samples are steeped in ethyl acetate for 30 minutes. The surrounding liquid is in all cases nearly colorless, demonstrating that the conversion to the pigmentary state is almost complete.

EXAMPLES 162–164

The procedure of Examples 159–161 is used, with the difference that the regeneration temperature is increased to 160° C. The surrounding liquid is in all cases absolutely colorless, demonstrating that the conversion to the pigmentary state is complete.

EXAMPLES 165–167

The procedure of Examples 159–161 is used, with the difference that 1.0 g of pigment precursor (A6) and 0.33 g of catalyst precursor B1 are used, and the regeneration is operated at 100° C. for 1 hour. The surrounding liquid is absolutely colorless in the case of obeche and poplar, demonstrating that the conversion to the pigmentary state is complete, and only nearly colorless in the case of fir, demonstrating that the conversion to the pigmentary state is almost complete.

EXAMPLES 168–170

The procedure of Examples 165–167 is used, with the difference that the regeneration is operated at 130° C. for 1 hour. The surrounding liquid is absolutely colorless in all cases including fir.

EXAMPLES 171–173

The procedure of Examples 168–170 is used, with the difference that pigment precursor (A7) is used instead of pigment precursor (A6). The surrounding liquid is absolutely colorless in all cases, demonstrating that the conversion to the pigmentary state is complete.

EXAMPLES 174–176

The procedure of Examples 162–164 is used, with the difference that pigment precursor (A8) is used instead of pigment precursor (A6). The surrounding liquid is absolutely colorless in all cases, demonstrating that the conversion to the pigmentary state is complete.

EXAMPLES 177–179

The procedure of Examples 174–176 is used, with the difference that the regeneration is operated at 130° C. The results are identical to those of Examples 174–176.

EXAMPLES 180–182

The procedure of Examples 174–176 is used, with the difference that the regeneration is operated at 100° C. for 1 hour. The results are identical to those of Examples 174–176.

EXAMPLES 183–185

The procedure of Examples 174–176 is used, with the difference that the regeneration is operated at 80° C. for 2 hours. The results are identical to those of Examples 174–176.

EXAMPLES 186–197

The procedure of Examples 174–185 is used, with the difference that 1.0 g of pigment precursor (A8) and 0.33 g of catalyst precursor B1 are used. The conversion to the pigmentary state is complete in all cases.

EXAMPLES 198–222

The obeche and poplar samples from Examples 33,157, 159, 160, 162, 163, 165, 166, 168, 169, 171, 172, 174, 175, 177, 178, 180, 181, 183, 184, 186, 187, 189, 190, 192, 193, 195 and 196 are cut transversally, and the cut is examined under the optical microscope. A homogeneous pigmentation throughout the cut is observed in all cases.

What is claimed is:

1. A coloured porous material comprising in its pores an effectively colouring amount of an organic pigment which is obtained by fragmenting a meltable or solvent-soluble pigment precursor, characterized in said fragmentation takes place in the presence of an effective amount of a strong acid obtained from a catalyst precursor at a temperature of from 40 to 160° C.

2. A porous material according to claim 1, wherein the temperature at which said catalyst precursor reacts thermally to produce a strong acid is from 80 to 120° C. and said strong acid has a $pK_a$ of 2 or lower.

3. A porous material according to claim 1, wherein said catalyst precursor is of formula

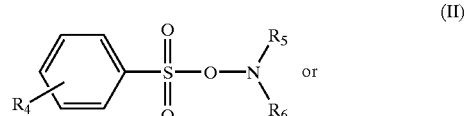

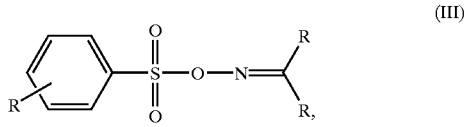

wherein $R_1$, $R_2$ and $R_3$ are independently from one another $C_1$–$C_{24}$alkyl, $C_6$–$C_{24}$aryl or $C_7$–$C_{24}$aralkyl, $R_4$ is $C_1$–$C_{24}$alkyl, $R_5$, $R_6$, $R_7$ and $R_8$ are independently from one another $C_1$–$C_{24}$alkyl, $C_6$–$C_{24}$aryl or $C_7$–$C_{24}$aralkyl, or $R_5$ and $R_6$ together or $R_7$ and $R_8$ together are $C_4$–$C_{24}$alkylen, $C_4$–$C_{24}$aralkylen, 3-oxa-pentylen or N—$C_1$–$C_{24}$alkyl-3-aza-pentylen, A is $PX_6$, $AsX_6$, $SbX_6$, $BX_4$, $R_9$—$SO_3$, $R_9$—$OSO_3$ or $R_{10}$—$PO_3R_{11}$, wherein $R_9$, $R_{10}$ and $R_{11}$ are independently from one another $C_1$–$C_{24}$alkyl, $C_6$–$C_{24}$aryl or $C_7$–$C_{24}$aralkyl, $R_{10}$ and $R_{11}$ are preferably $C_1$–$C_{24}$alkyl, most preferably $C_1$–$C_4$alkyl, particularly methyl, and X is halogen.

4. A porous material according to claim 1, which is composed of refined or unrefined organic components of natural origin.

5. A porous material according to claim 1, wherein the amount of organic pigment in the pores of the coloured material is from 0.01 to 30% by weight based on the weight of said coloured material.

6. A porous material according to claim 1, wherein the pigment precursor possesses a structure which includes a complete pigment framework substituted on at least one heteroatom N, O or S.

7. A porous material according to claim 6, wherein the pigment precursor is a compound of the formula (I)

in which x is an integer from 1 to 8,

A is the radical of a chromophor of the quinacridone, anthraquinone, perylene, indigo, quinophthalone, indanthrone, isoindolinone, isoindoline, dioxazine, azo, phthalocyanine or diketopyrrolopyrrole series which is attached to x groups B via one or more heteroatoms selected from the group consisting of N, O and S and forming part of the radical A, B is hydrogen or a group of the formula

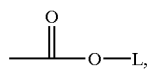

where at least one group B is not hydrogen and, if x is from 2 to 8, the groups B can be identical or different, and L is any suitable solubilizing group.

8. A porous material according to claim 7, in which —L is a group of the formula

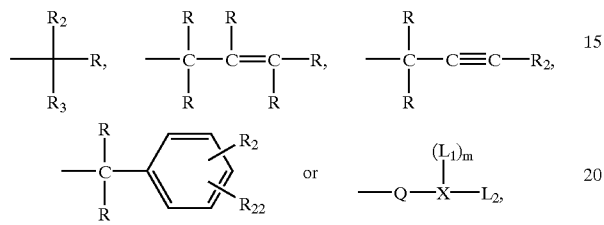

in which $R_{12}$, $R_{14}$ and $R_{13}$ independently of one another are $C_1$–$C_6$alkyl, $R_{15}$ and $R_{16}$ independently of one another are $C_1$–$C_6$alkyl, O, S or $N(R_{23})_2$-interrupted $C_1$–$C_6$alkyl, unsubstituted or $C_1$–$C_6$alkyl-, $C_1$–$C_6$alkoxy-, halo-, cyano- or nitro-substituted phenyl or biphenylyl, $R_{17}$, $R_{18}$ and $R_{19}$ independently of one another are hydrogen or $C_1$–$C_6$alkyl, $R_{20}$ is hydrogen, $C_1$–$C_6$alkyl or a group of the formula

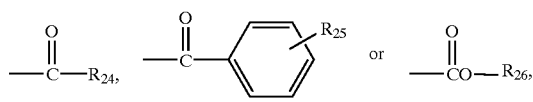

$R_{21}$ and $R_{22}$ independently of one another are hydrogen, $C_1$–$C_6$alkyl, $C_1$–$C_6$alkoxy, halogen, cyano, nitro, $N(R_{23})_2$, unsubstituted or halo-, cyano-, nitro-, $C_1$–$C_6$alkyl- or $C_1$–$C_6$alkoxy-substituted phenyl, $R_{23}$ and $R_{24}$ are $C_1$–$C_6$alkyl, $R_{25}$ is hydrogen or $C_1$–$C_6$alkyl and $R_{26}$ is hydrogen, $C_1$–$C_6$alkyl, unsubstituted or $C_1$–$C_6$alkyl-substituted phenyl, Q is p,q-$C_2$–$C_6$alkylene which is unsubstituted or substituted one or more times by $C_1$–$C_6$alkoxy, $C_1$–$C_6$alkylthio or $C_2$–$C_{12}$dialkylamino, p and q being different numeric locants, X is a heteroatom selected from the group consisting of N, O and S, where m is 0 if X is O or S and is 1 if X is N, and $L_1$ and $L_2$ independently of one another are unsubstituted or mono- or poly-$C_1$–$C_{12}$alkoxy-, —$C_1$–$C_{12}$alkylthio-, —$C_2$–$C_{24}$dialkylamino-, —$C_6$–$C_{12}$aryloxy-, —$C_6$–$C_{12}$arylthio-, —$C_7$–$C_{24}$alkylarylamino- or —$C_{12}$–$C_{24}$diarylamino-substituted $C_1$–$C_6$alkyl or [-(p', q'—$C_2$–$C_6$alkylene)-Z—]$_n$—$C_1$–$C_6$alkyl, where n is a number from 1 to 1000, p' and q' are different numeric locants, each Z independently of the others is a heteroatom O, S or $C_1$–$C_{12}$alkyl-substituted N, and $C_2$–$C_6$alkylene in the repeating units [—$C_2$–$C_6$alkylene-Z—] can be identical or different, and $L_1$ and $L_2$ can be saturated or mono- to deca-unsaturated, uninterrupted or interrupted in any desired points by from 1 to 10 groups selected from the group consisting of —(C=O)— and —$C_6H_4$—, and may carry no or 1 to 10 further substituents selected from the group consisting of halogen, cyano and nitro.

9. A process for preparing a coloured porous material whose pores comprise an effectively colouring amount of an organic pigment, comprising (a) the treatment of a porous material with a solution or melt of a pigment precursor also comprising an effective amount a catalyst precursor which can be reacted to produce a strong acid at a temperature of from 40 to 160° C., at a temperature lower than the temperature at which said catalyst precursor reacts thermally to produce said strong acid, such that at least part of the pigment precursor enters the pores of the material, and (b) the fragmentation of the pigment precursor that has entered the pores of the material in accordance with treatment (a), to form a pigment, by means of heating or irradiation to a temperature of from 40 to 160° C. at which said catalyst precursor reacts thermally to produce said strong acid.

10. A process according to claim 9, wherein step (b) is accomplished by heating to a temperature of from 60 to 140° C or by irradiating with an amount of energy sufficient for said pigment precursor to be heated to said temperature.

11. A coloured porous material comprising in its pores an effectively colouring amount of an organic pigment or a combination of organic pigments each obtained by fragmenting a meltable or solvent-soluble pigment precursor, characterized in said porous material has a brown pigmentation which consists essentially of a brown disazo condensation pigment or a mixture of a yellow disazo condensation pigment, a bluish red Naphthol AS pigment and a blue copper phthalocyanine pigment which is substituted with 1 to 4 sulfonamido groups at peripheric positions of its phenyl rings.

12. A porous material according to claim 1, which is composed of wood, leather or hair.

13. A porous material according to claim 1, wherein the amount of organic pigment in the pores of the coloured material is from 0.1 to 15% by weight based on the weight of said coloured material.

14. A process according to claim 9, wherein step (b) is accomplished by heating to a temperature of from 80 to 120° C. or by irradiating with an amount of energy sufficient for said pigment precursor to be heated to said temperature.

* * * * *

UNITED STATES PATENT AND TRADEMARK OFFICE
CERTIFICATE OF CORRECTION

PATENT NO.    : 6,495,250 B1
DATED         : December 17, 2002
INVENTOR(S)   : Hans-Thomas Schacht It is certified that error appears in the above-identified patent and that said Letters Patent is hereby corrected as shown below:

Column 22,
Line 20, should read:

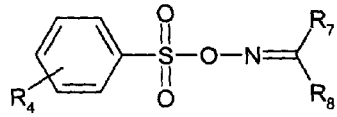

Column 23,
Lines 15-20, should read:

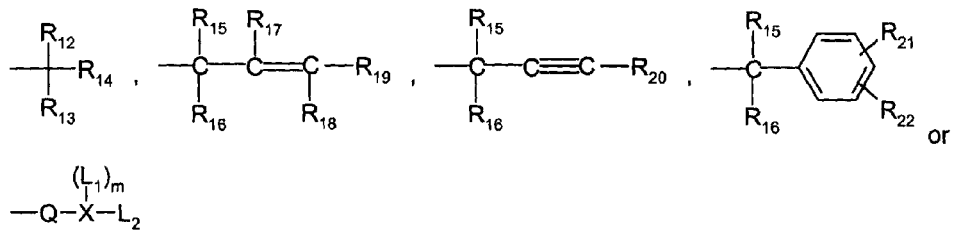

Signed and Sealed this

Twenty-seventh Day of September, 2005

JON W. DUDAS
*Director of the United States Patent and Trademark Office*